(12) United States Patent
Lustenberger

(10) Patent No.: US 10,012,696 B2
(45) Date of Patent: Jul. 3, 2018

(54) BATTERY-ASSISTED SAFETY CIRCUIT MONITORING SYSTEM

(71) Applicant: Inventio AG, Hergiswil (CH)

(72) Inventor: Ivo Lustenberger, Buttisholz (CH)

(73) Assignee: INVENTIO AG, Hergiswil (CH)

( * ) Notice: Subject to any disclaimer, the term of this patent is extended or adjusted under 35 U.S.C. 154(b) by 417 days.

(21) Appl. No.: 14/767,366

(22) PCT Filed: Jan. 20, 2014

(86) PCT No.: PCT/EP2014/050973
§ 371 (c)(1),
(2) Date: Aug. 12, 2015

(87) PCT Pub. No.: WO2014/124779
PCT Pub. Date: Aug. 21, 2014

(65) Prior Publication Data
US 2015/0377968 A1    Dec. 31, 2015

(30) Foreign Application Priority Data

Feb. 12, 2013   (EP) .................................... 13154905

(51) Int. Cl.
*B66B 1/34*        (2006.01)
*G01R 31/327*    (2006.01)
*B66B 5/00*        (2006.01)
*B66B 13/22*      (2006.01)
*B66B 29/00*      (2006.01)

(52) U.S. Cl.
CPC .......... *G01R 31/327* (2013.01); *B66B 5/0006* (2013.01); *B66B 5/0031* (2013.01); *B66B 5/0043* (2013.01); *B66B 5/0087* (2013.01); *B66B 13/22* (2013.01); *B66B 29/005* (2013.01)

(58) Field of Classification Search
CPC ... G01R 31/327; B66B 5/0006; B66B 5/0031; B66B 5/0043; B66B 5/0087; B66B 13/22; B66B 29/005
USPC .............. 187/247, 287, 289, 290, 316, 317, 187/391–393; 49/26, 120; 340/505, 507, 340/518, 521, 522, 531, 539, 542, 825.69
See application file for complete search history.

(56) References Cited

U.S. PATENT DOCUMENTS

| | | | |
|---|---|---|---|
| 5,107,964 A * | 4/1992 | Coste | B66B 13/24 187/280 |
| 5,708,416 A * | 1/1998 | Zaharia | B66B 27/00 198/322 |

(Continued)

FOREIGN PATENT DOCUMENTS

| | | |
|---|---|---|
| CN | 102020158 A | 4/2011 |
| CN | 102145840 A | 8/2011 |

(Continued)

*Primary Examiner* — Anthony Salata
(74) *Attorney, Agent, or Firm* — William J. Clemens; Shumaker, Loop & Kendrick, LLP

(57) ABSTRACT

A monitoring system for transport installations for persons, which installations are arranged as elevator, escalator or moving walkway, includes at least one interrogation device and at least one safety switch, which switch is connected with the interrogation device by an electrical safety circuit and which monitors a door lock of the transport installation for persons. An independent energy supply device supplies power to the interrogation device.

15 Claims, 3 Drawing Sheets

(56) References Cited

U.S. PATENT DOCUMENTS

| | | | |
|---|---|---|---|
| 6,173,814 B1 * | 1/2001 | Herkel | B66B 1/34 187/248 |
| 6,193,019 B1 | 2/2001 | Sirigu et al. | |
| 6,223,861 B1 * | 5/2001 | Sansevero | B66B 13/22 187/316 |
| 6,467,585 B1 * | 10/2002 | Gozzo | B66B 13/22 187/247 |
| 6,484,125 B1 * | 11/2002 | Huang | B66B 5/0006 187/393 |
| 7,077,244 B2 * | 7/2006 | Oh | B66B 1/40 187/394 |
| 7,264,090 B2 * | 9/2007 | Vecchiotti | B66B 13/22 187/247 |
| 7,334,665 B2 * | 2/2008 | Smith | B66B 1/34 187/247 |
| 7,575,102 B2 * | 8/2009 | Matsuoka | B66B 5/0093 187/391 |
| 8,552,738 B2 * | 10/2013 | Quinn | B66B 13/22 187/391 |
| 8,939,262 B2 * | 1/2015 | Schienda | B66B 5/06 187/287 |
| 2008/0309469 A1 | 12/2008 | Ferre Fabregas et al. | |
| 2012/0080273 A1 * | 4/2012 | Herkel | B66B 1/34 187/247 |
| 2016/0033577 A1 * | 2/2016 | Lustenberger | B66B 5/0031 324/750.01 |
| 2016/0311653 A1 * | 10/2016 | Muller | B66B 5/0093 |
| 2017/0341906 A1 * | 11/2017 | Muller | B66B 5/0093 |

FOREIGN PATENT DOCUMENTS

| | | |
|---|---|---|
| EP | 1440930 A2 | 7/2004 |
| JP | 05286659 A * | 11/1993 |
| JP | H1121052 A | 1/1999 |
| TW | 201131322 A | 9/2011 |
| WO | 2012141713 A1 | 10/2012 |

* cited by examiner

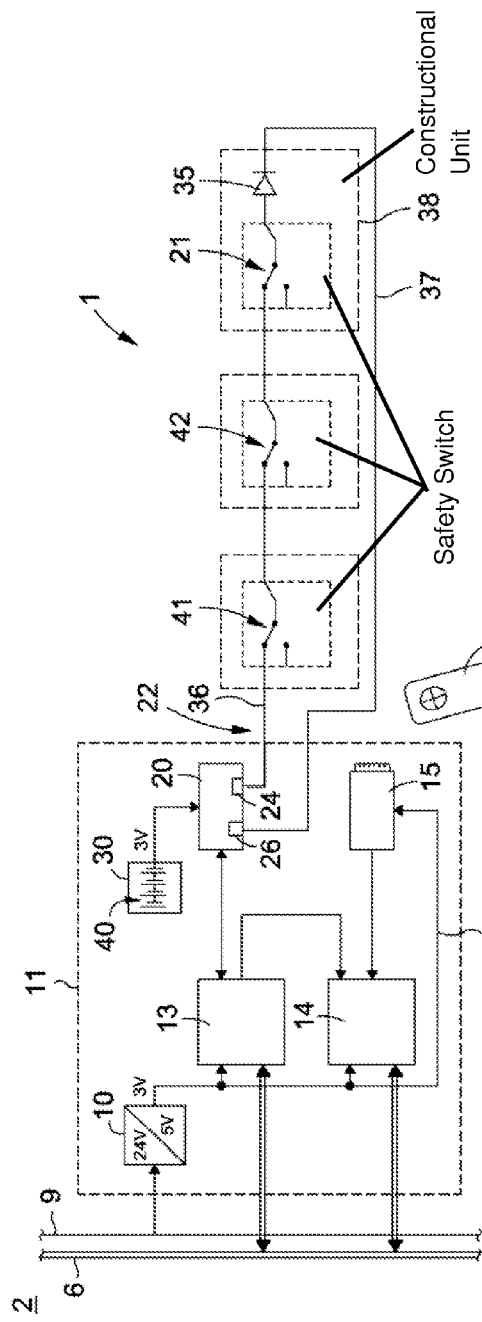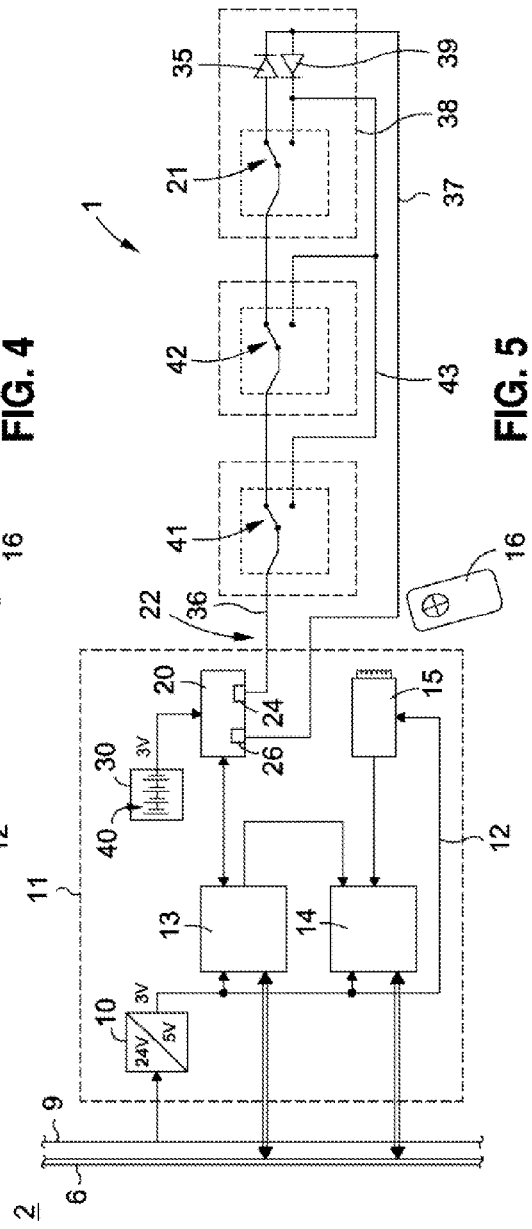

BATTERY-ASSISTED SAFETY CIRCUIT MONITORING SYSTEM

FIELD

The invention relates to a monitoring system for transport installations for persons, which installations are arranged as elevator, escalator or moving walkway, to such a transport installation for persons and to a method for such a transport installation for persons. The invention specifically relates to the field of elevator installations.

BACKGROUND

A device for monitoring doors of an elevator installation is known from U.S. Pat. No. 6,193,019 B1, wherein the doors are present on several floors. In that case, a safety circuit in the form of a chain of switches, which are arranged at locks of the doors, is present. A resistance is connected in parallel with each of these switches. The respective resistance is bridged over when the switch is closed. The resistance values are formed as a product of a power of two and a reference resistance. The exponent, which is a non-negative whole number, in that case corresponds with the floor on which is arranged the door to which the lock with the associated resistance relates. If one or more switches are opened then it can be calculated from the sum of the resistances at the open switches, which indicates the total resistance with respect thereto of the resistances at the open switches, which switches are open. This can be output by way of a suitable indicating device.

The device, which is known from U.S. Pat. No. 6,193,019 B1, for monitoring the doors of an elevator installation has the disadvantage that opening and subsequent closing of a lock cannot be recognized if the energy supply is interrupted during this time period.

A door closure for a door of an elevator is known from EP 1 440 930 A2. The known door closure comprises a housing and a latch, wherein the latch is transferrable with respect to the door into a locking setting and into a release setting. The latch is in that regard mounted in the housing. The closure comprises a manually actuable emergency unlocking device for transferring the latch into its release setting, wherein the emergency unlocking device comprises an entrainer which when the latch is transferred into the release setting is actuable by an emergency unlocking key. In addition, a constrainedly opening safety switch or at least a part of a corresponding electrical safety circuit and a manually actuable entrainer associated therewith for actuation of the safety switch or the safety circuit is present at or in the housing. The door closure can be constructed in such a manner that through actuation of the emergency unlocking device initially the safety switch is actuated and subsequently thereto the latch is transferred into its release setting. Normal operation of an item of equipment associated with the door can be interrupted and reinstated by a safety circuit when the safety switch is switched.

In the case of, especially, elevator installations, which have a reduced shaft head or no shaft head in the elevator shaft, monitoring of door closures, particularly three-square head locks, of shaft doors is required. It can thereby be established whether anybody could have gone onto the car roof of the elevator car. When a three-square head lock is opened a safety switch is opened which interrupts a safety circuit. If the safety switch, as described in EP 1 440 930 A2, has a detent function then the elevator installation is stopped until a service engineer places this back in operation after a suitable check. However, if, for example, an energy supply now temporarily fails then opening and subsequent closing of the switch is not recognized. If this problem is not taken into account then somebody can go unrecognized into the elevator shaft, particularly onto the car roof without this being recognized, as a result of which serious accidents can happen. In order to take this into account it is conceivable that, after power failure, placing of the elevator installation into operation may be carried out only after a prescribed taking-out-of-operation program by an authorized service engineer. However, this always has to be carried out regardless of whether or not anybody has opened a door. This has the consequence, even in the case of comparatively short failures of the energy supply, of a substantial disruption to the operating program, since the elevator installation is out of operation for a comparatively lengthy period of time determined by, inter alia, the time until arrival of the service engineer and the time for carrying out the taking-out-of-operation program.

SUMMARY

An object of the invention is to indicate a monitoring system for transport installations for persons, which installations are arranged as elevator, escalator or moving walkway, such a transport installation for persons and a method for monitoring such a transport installation for persons, the system, installation and method being of improved design. In particular, it is an object of the invention to indicate a monitoring system for transport installations for persons, which installations are arranged as elevator, escalator or moving walkway, such a transport installation for persons and a method for monitoring such a transport installation for persons which make possible improved monitoring of at least one item of equipment of the transport installation for persons, wherein monitoring is made possible even in the case of a power-free state of the transport installation for persons. In particular, it can thereby made possible for the transport installation for persons to automatically return to normal travel after a power failure if in the interim no monitored shaft door or the like has been opened.

The objects are fulfilled by a monitoring system for transport installations for persons, which installations are arranged as elevator, escalator or moving walkway. The monitoring system includes at least one interrogation device and at least one safety switch, which is connected with the interrogation device by way of an electrical safety circuit and which serves for monitoring an item of equipment of the transport installation for persons. The safety switch has at least two switch settings. In addition, an independent energy supply device supplying the interrogation device with electrical energy is present. As a result, a change in the switch setting of the safety switch can be detected by means of the interrogation device, independently of the presence of an external energy supply means of the transport installation for persons, and at least one status signal can be generated from the change in the switch setting. Thanks to the independent energy supply device the status signal can be stored in the interrogation device and called up by a control of the transport installation for persons as soon as this is again in a position for that purpose after a power failure.

It is advantageous that the independent energy supply device is arranged at the interrogation device. In that case, the independent energy supply device can be accommodated in, in particular, a common housing together with the interrogation device. Moreover, it is advantageous if the interrogation device is designed to apply a test voltage to the electrical safety circuit. The test voltage can be produced, in particular, in the case of interruption of an external energy supply means, by way of the independent energy supply device which is present.

It is also advantageous if the independent energy supply device comprises at least one battery element and/or at least one accumulator element. The battery element and/or the accumulator element can in that regard be checked within the scope of regular maintenance and in a given case exchanged. Construction as an accumulator element has the advantage that on the one hand charging by way of an external energy supply means is possible. On the other hand, the accumulator element makes available, not only in the case of an intact, but also in the case of an interrupted external energy supply, the operating voltage—which is needed by the interrogation device—always at a desired level when the external energy supply means serves for charging the accumulator element.

It is also advantageous if the interrogation device can be supplied with power at least indirectly by an external energy supply means and if the interrogation device can be supplied with power from the independent energy supply device at least in the case of interruption of the external energy supply means. Additionally or alternatively it is thus of advantage for the external energy supply means to serve for charging the at least one accumulator element. In particular, the interrogation device can be supplied with power by means of the accumulator element or a device also serving for charging the accumulator element, wherein charging of the accumulator element is possible at the same time.

Moreover, it is advantageous—when the safety switch is designed as a safety switch which can be switched over—if the safety switch in a first switch setting closes the safety circuit by way of a first line section connected at least indirectly with the interrogation device and if the safety switch in a second switch setting closes the safety circuit by way of a second line section connected at least indirectly with the interrogation device. In this regard, it is also of advantage if the first line section is connected with a first input terminal and/or output terminal of the interrogation device, if the second line section is connected with a second input terminal and/or output terminal of the interrogation device, if a return line connected with a third input terminal and/or output terminal of the interrogation device is present, if the safety switch in the first switch setting closes the safety circuit by way of the first line section and by way of the return line and if the safety switch in the second switch setting closes the safety circuit by way of the second line section and the return line. The monitored item of equipment of the transport installation for persons can be constructed as, for example, a door lock. Then, not only the open state of the door lock, but also the closed state of door lock can be interrogated by way of the two switch settings of the associated safety switch. This is entirely possible even in the case of interruption of an external energy supply means, since the independent energy supply device is provided for the interrogation device. Thus, after interruption of the external energy supply means it can be reported, for example to a control, particularly an elevator control, whether or not an interim opening of the door lock has taken place. If the door lock was always closed then there is no safety-relevant ground with respect thereto to generate a corresponding status signal and interrupt operation of the elevator installation. Operation of the transport installation for persons, particularly the elevator installation, can thus be resumed automatically. Unnecessary interruptions of operation after power failure can thus be avoided.

However, opening during a power failure is also reliably recognized. This then also makes possible a concrete report of the safety-relevant reason or the communication of a corresponding status signal for an interruption after a power failure. For example, the floor or the actual item of equipment, in particular the door lock, can be selectively stored as safety-relevant reason for the interruption and indicated to a service engineer. This simplifies the search and reduces the cost for returning to operation. Moreover, safety is improved, since the safety-relevant reason is explicitly indicated and thus cannot be overlooked. This is also of significance when several causes for an interruption are cumulatively present. For example, apart from the described door lock opened for a time a further door lock can additionally be open. The service engineer can then recognize not only the opened further door lock as a cause, but also the door lock opened for a time only during the power interruption. As a result, safety is also improved.

Advantageously, at least one unit with dependency on current direction is present in the safety circuit, wherein the interrogation device is constructed to apply a test voltage with a changing polarity to the electrical circuit. The unit with dependency on current direction has an electrical property dependent on current direction. Moreover, it is advantageous in this case if the interrogation unit is constructed to apply the test voltage to the electrical safety circuit always between a first terminal and a second terminal. Thus, only two terminals are needed at the interrogation unit. This additionally makes possible a design in which only two electrical lines, or at least sectionally only two electrical lines, are present. The design of the monitoring system is thus simplified.

In that regard it is additionally advantageous if the at least one safety switch in a first setting or—if several safety switches are present in the safety chain—in a first combination of switch settings closes the safety circuit by way of the unit with current direction dependency. Moreover, the at least one safety switch in a second switch setting or in another combination of switch settings differing from the first combination of switch settings can open the safety circuit. Thus, no current signal is detectable when the safety switch is open regardless of the polarity of the test voltage. It can thus be concluded that the safety switch is open. A disturbance which may happen to be present and which similarly leads to no flow of current can then be treated as an open switch. Thus, for example, a line breakage can also be reliably recognized.

However, it is also advantageous in the case of a modified embodiment if the at least one safety switch in a second switch setting or in another combination of switch settings differing from the first combination of switch settings closes the safety circuit not by way of the unit with dependency on current direction, but by way of a further unit, which has current direction dependency, with an electrical characteristic dependent on current direction. Thus, through application of the test voltage with alternating polarity to the safety circuit it can be recognized whether the safety circuit exhibits the behavior given by the unit with dependency on current direction or the behavior given by the further unit with dependency on current direction. A clear distinction can thus be made between the first switch setting and the further switch setting of the safety switch or one combination of switch settings and any other combination of switch settings. In addition, in that case disturbances manifesting themselves as a short-circuit or an interruption can also be reliably recognized, because with these disturbances the behavior of the safety circuit depends on each occasion, on the current direction. Correspondingly, through suitable evaluation it is possible to also recognize other disturbances, for example a short-circuit which bridges over a safety switch of several safety switches.

Moreover, it is advantageous if a control device is present which comprises the interrogation device and if the control device in the case of actuation of the item of equipment monitored by the safety switch reports the actuation to a central control by way of an interface and a bus system. The central control can be, in particular, an elevator control. In this regard it is additionally advantageous if a destination call input unit with an RFID interface is present on each floor and if the RFID interface is connected with the bus system by way of the interface. Thus, the interface—which is required anyway for the RFID interface—to the bus system can also be used by the monitoring device. Production outlay is thus reduced.

As explained in the foregoing, a reliable interrogation of a lock, particularly a three-square head lock, or another item of equipment of the transport installation for persons is possible by way of the safety circuit. If an external energy supply means for the transport installation for persons is interrupted and if during this time anybody, for example, gains access to an elevator shaft and closes the shaft door again such an access can still be reliably ascertained. The interrogation device, which can be part of a control device, ensures that the setting of the safety switch is correctly detected. Depending on the respective design of the safety switch an opener contact and a closer contact of the safety switch can be present for that purpose, in which case reading-in the switch settings takes place in a non-equivalence manner. In one possible embodiment a dynamic power supply in the form of the test voltage with the changing polarity is additionally possible. This makes possible correct reading back by way of the input terminals of the interrogation device. In this regard, use can advantageously be made of one or more units with dependency on current direction. Such a unit with dependency on current direction can, for example, be formed by a diode or comprise a diode.

DESCRIPTION OF THE DRAWINGS

Preferred embodiments of the invention are explained in more detail in the following description by way of the accompanying drawings, in which corresponding elements are provided with corresponding reference numerals and in which:

FIG. 4 shows a monitoring system for a transport installation for persons in a schematic illustration, in the manner of a detail, in correspondence with a fourth embodiment of the invention; and FIG. 5 shows a monitoring system for a transport installation for persons in a schematic illustration, in the manner of a detail, in correspondence with a fifth embodiment of the invention.

DETAILED DESCRIPTION

Figure 1:
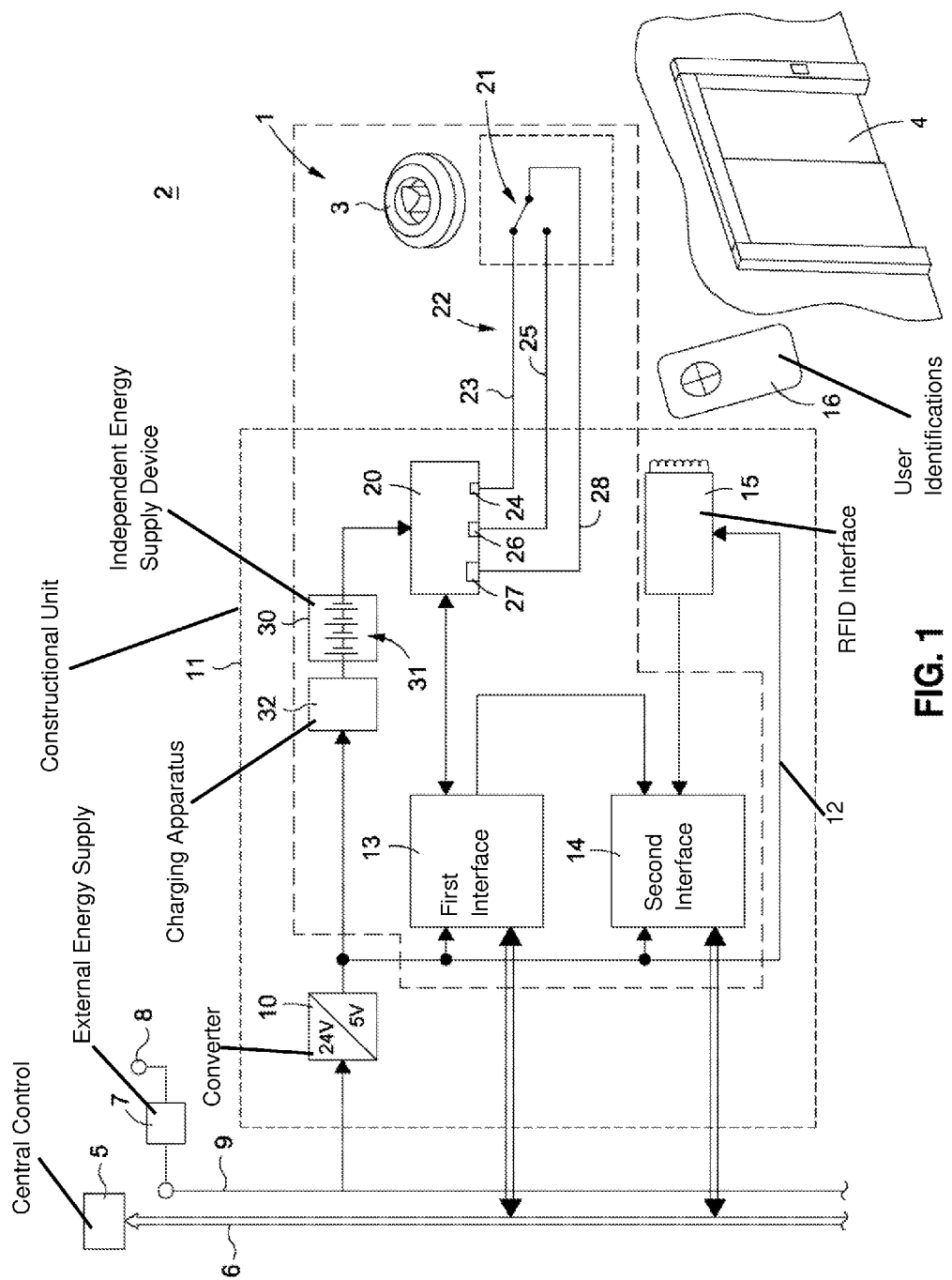
FIG. 1 shows a monitoring system for a transport installation for persons in a schematic illustration, in the manner of a detail, in correspondence with a first embodiment of the invention.

FIG. 1 shows a monitoring system 1 for a transport installation 2 for persons in a schematic illustration, in the manner of a detail, in a first embodiment. The transport installation 2 for persons is, in this embodiment, constructed as an elevator installation 2. In general, the transport installation 2 for persons can be arranged as an elevator (elevator installation), an escalator or a moving walkway. The monitoring system 1 is then a component of the transport installation 2 for persons. The monitoring system can, however, also be produced or marketed independently of a transport installation 2 for persons. The monitoring system 1 serves for monitoring an item of equipment 3 of the transport installation for persons. The item of equipment 3 is in that case not necessarily a component of the monitoring installation 1. However, the item of equipment 3 can, depending on the respective design of the monitoring system 1, also be entirely or partly a component of the monitoring system 1.

In this embodiment the transport installation 2 for persons has a door 4 which is constructed as a shaft door 4. In that case the door 4 is located on a floor of a building in which the elevator installation 2 is installed. The item of equipment 3 is associated with the door 4. The item of equipment 3 in this embodiment is a lock 3 designed as a door lock 3. Specifically, in this embodiment the door lock 3 is constructed as a three-square head lock 3. Through opening or closing the door lock 3 the door 4 can be unlocked or locked. In the unlocked state the door 4 can be opened manually. Consequently, for example, an operator, particularly a service engineer or a maintenance operative, can enter an elevator shaft (not illustrated) and optionally also go onto a car roof of an elevator car of the elevator installation 2.

The monitoring system 1 comprises a central control 5 which can be integrated in an elevator control or the like. The central control 5 is coupled with a bus system 6. The bus system 6 can in that case serve as a common bus system 6 for the transport installation 2 for persons. However, the bus system 6 can also be provided as an exclusive bus system for the monitoring system 1. Also present is an external energy supply means 7 which, for example, is connected with a power mains by way of a mains terminal 8. In this embodiment the external energy supply 7 provides a supply voltage of 24 V by way of a power supply line 9. The power supply line 9 can in that regard be arranged parallelly to the bus system 6.

Present in the region of the door 4 is a converter 10 which converts the power supply voltage of 24 V from the power supply line 9 into a supply voltage of 5 V, which can be tapped within a constructional unit 11 from a local power supply line 12.

In addition, a first interface 13 and a second interface 14, which are connected with the local power supply line 12, are accommodated within the constructional unit 11. The first interface 13 is in that case connected with the bus system 6 so as to receive data from the bus system 6 and so as to output data by way of the bus system 6. The second interface 14 is present primarily for safety reasons, wherein it is connected with the bus system 6 and with the first interface 13 and monitors the first interface 13. In particular, communication with the central control 5 can take place by way of the first interface 13 and by way of the second interface 14.

In addition, in this embodiment an RFID interface 15 is present, which is similarly connected with the bus system 6 by way of the interface 14. The RFID interface 14 in normal operation enables access by way of user identifications 16 in which individual RFID characterizations are contained. The elevator car can be called by the signal patterns of the RFID characterizations of the user identifications 16.

The monitoring system 1 additionally comprises an interrogation device 20. The interrogation device 20 can in that case also be a component of a control device 20. The interrogation device 20 in the present example exchanges data with the first interface 13. The interrogation device can obviously also exchange data with the second interface 14 or via both interfaces. In that regard the interrogation device 20 can receive data from the bus system 6 and issue data to the bus system 6 via the first interface 13 and/or the second interface 14. The interface 14 can thus be used not only by the RFID interface 15, but also by the interrogation device 20 in order to communicate with, for example, the elevator control, particularly the central control 5, by way of the bus system 6. Only a common interface can also be present, so that the interrogation device 20 and the RFID interface 15 are connected with the bus system 6 only by way of this common interface.

The monitoring system 1 comprises a safety switch 21 which is connected with the interrogation device 20 by way of an electrical safety circuit 22. The safety switch 21 serves for monitoring the item of equipment 3, which in this embodiment is constructed as door lock 3. In that case the safety switch 21 can also be integrated entirely or partly in such an item of equipment 3. The interrogation device 20 applies a test voltage to the electrical safety circuit 21 in order to interrogate the switching state of the safety switch 21.

In this embodiment the safety switch 21 is constructed as a safety switch 21 which can be switched over. In a first switch setting the safety switch 21 closes the electrical safety circuit 22 by way of a first line section 23, which is connected with a first input terminal and/or output terminal 24. This first switch setting of the safety switch 21 is illustrated in FIG. 1. In a second switch setting the safety switch 21 closes the electrical safety circuit 22 by way of a second line section 25, which is connected with a second input terminal and/or output terminal 26. Apart from the first input and/or output terminal 24 and the second input and/or output terminal 26 the interrogation device 20 additionally has a third input terminal and/or output terminal 27, which is connected with a return line 28. In the first switch setting the safety switch 21 closes the safety circuit 22 by way of the first line section 23 and the return line 28. In addition, in the second switch setting the safety switch 21 closes the safety circuit 22 by way of the second line section 25 and the return line 28. A non-equivalence is thus given, in which always one line path is closed and the other is open. A reliable interrogation of the safety switch 21 through use of the constrainedly guided safety switch 21 is thus ensured.

The monitoring system 1 comprises an independent energy supply device 30, which is arranged at the interrogation device 20. In this embodiment the independent energy supply device 30 and the interrogation device 20 are both located within the constructional unit 11. In particular, the independent energy supply device 30 and the interrogation device 20 can be accommodated within a common housing. In this embodiment the independent energy supply device 30 comprises a plurality of accumulator elements 31. The interrogation device 20 can be supplied with energy, particularly with a suitable supply voltage, by way of the independent energy supply device 30. The supply voltage can be, for example, 3 V.

Also present in this embodiment is charging apparatus 32 which is supplied with power by way of the local power supply line 12. The power supply of the charging apparatus 32 is in that case dependent on the external energy supply means 7. Through the charging apparatus 32 the accumulator elements 31 of the independent energy supply device 30 can be constantly kept in an at least partly charged state. Moreover, an indirect power supply of the interrogation device 20 with energy from the external energy supply means 7 is also possible by way of the charging apparatus 32 and the independent energy supply device 30 as long as the external energy supply means 7 is active.

If the external energy supply means 7 is interrupted, then energy supply by way of the local power supply line 12 is also interrupted. However, the interrogation device 20 is then still supplied with energy, namely by the independent energy supply device 30. Thus, reliable interrogation of the safety switch 21 is possible even in the case of power failure.

If the interrogation device 20 recognizes that the safety switch 21 is for a time in the second switch setting, then, for example, a corresponding flag is set. When the external energy supply means 7 is active again, a corresponding report to the central control 5 can be carried out by way of the bus system 6 as a consequence of the set flag.

The interrogation device 20 can thus be supplied with power by the independent energy supply device 30. In that regard, the interrogation device 20 can additionally be supplied with power at least indirectly by the external energy supply means 7. In the case of interruption of the external energy supply means 7 the interrogation device 20 can then be supplied with power by the independent energy supply device 30. The external energy supply means 7 additionally also serves for charging the at least one accumulator element 31 of the independent energy supply device 30.

Interruption of the electrical safety circuit 22 is thus similarly detectable, since a signal then cannot be detected either by way of the first input and/or output terminal 24 or by way of the second input and/or output terminal 26 of the interrogation unit 20 when the interruption is relevant. Faulty functioning is thus also detectable.

Figure 2:
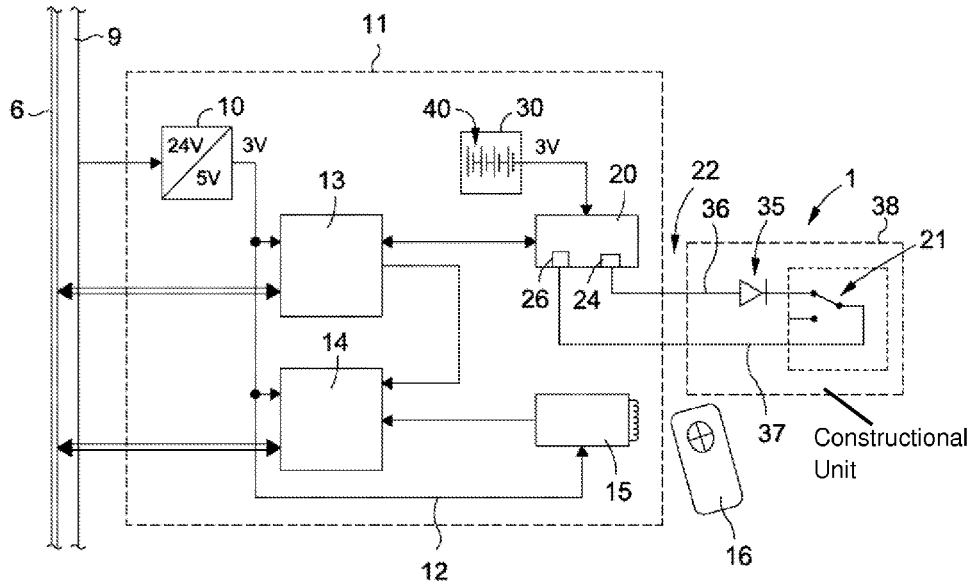
FIG. 2 shows a monitoring system for a transport installation for persons in a schematic illustration, in the manner of a detail, in correspondence with a second embodiment of the invention.

FIG. 2 shows in schematic illustration, in the manner of a detail, a monitoring system 1 for a transport installation 2 for persons in correspondence with a second embodiment. In this embodiment the monitoring device 1 comprises the safety switch 21 and a unit 35, which has dependency on current direction, with a characteristic dependent on current direction. The unit 35 with dependency on current direction is in this embodiment constructed as a diode arranged in the safety circuit 22. In this embodiment the diode 35 is arranged in a line 36 which is connected on the one hand with the first input and/or output terminal 24 of the interrogation unit 20 and on the other hand with the safety switch 21. In addition, the safety switch 21 is connected with the second input and/or output terminal 26 by way of a line 37.

The unit 35 with dependency on current direction in that case forms, together with the safety switch 21, a constructional unit 38. In that case a pin of the diode 35 can be mounted directly on a contact or output of the safety switch 21.

In this embodiment the interrogation device 20 is designed so that the test voltage is applied with alternating polarity to the electrical safety circuit 22. The characteristic dependent on current direction, which is preset by the unit 35 with dependency on current direction, of the electrical safety circuit 22 can thereby be interrogated. If there is a disturbance in the safety circuit 22 due to, for example, a short-circuit then a current flow always results regardless of the polarity of the test voltage. The interrogation device 20 thus recognizes that the mentioned disturbance is present. If the safety switch 21 is open, then regardless of the polarity of the test voltage there is no current flow. A disturbance of the electrical safety circuit 22 in the form of, for example, a line breakage can in that case be dealt with in correspondence with an open safety switch 21. After an interruption of the elevator installation the service operative then seeks the cause of the interruption. Through the diode 35 the characteristic dependent on current direction consists of the current being either blocked or let through. In a modified embodiment, however, other characteristics with dependency on current direction are also achievable. In particular, different resistance values can also be interrogated in dependence on the current direction.

Figure 3:
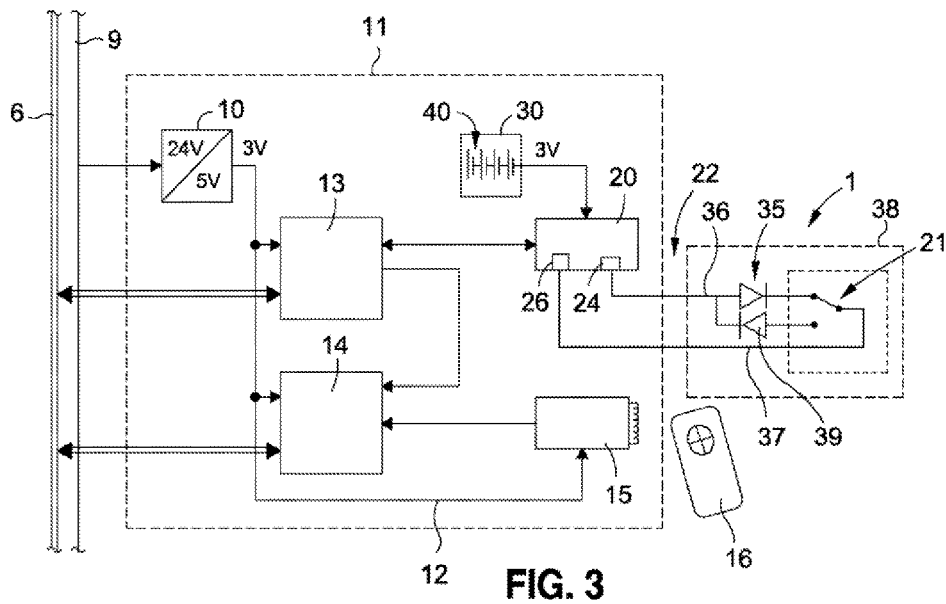
FIG. 3 shows a monitoring system for a transport installation for persons in a schematic illustration, in the manner of a detail, in correspondence with a third embodiment of the invention.

In this embodiment, as well, the independent energy supply device 30 is also provided for interrogation of the electrical safety circuit 22. The independent energy supply device 30 in this embodiment comprises a plurality of battery elements 40. The battery elements 40 can in that regard be checked within the scope of predetermined maintenance and in a given case exchanged. FIG. 3 shows in schematic illustration, in the manner of a detail, a monitoring system 1 for a transport installation 2 for persons in correspondence with a third embodiment. In this embodiment the safety switch 21 in a first switch setting closes the safety circuit 22 by way of the diode 35. The first switch setting of the safety switch 21 is illustrated in FIG. 3. In a second switch setting of the safety switch 21 the electrical safety circuit 22 is closed by way of a further unit 39, which has dependency on current direction, with a characteristic dependent on current direction. The further unit 39 with dependency on current direction is in this embodiment constructed as a diode 39. In that regard, the characteristics, which are dependent on current direction, of the units 35, 39 with dependency on current direction differ from one another. It is in that case achieved in this embodiment that the diodes 35, 39 have, so to speak, anti-parallel connection with respect to one another relative to a current direction from the terminal 26 to the terminal 24 in the respective switch setting of the safety switch 21.

Thus, the following behavior arises in this embodiment depending on the polarity of the test voltage. In the first switch setting of the safety switch 21 the diode 35 blocks current flow from the terminal 26 to the terminal 24, whereas current flow from the terminal 24 to the terminal 26 is allowed. Conversely, in the second switch setting of the safety switch 21 the diode 39 blocks current flow from the terminal 24 to the terminal 26, whereas current flow from the terminal 26 to the terminal 24 is allowed. Thus, uniquely resulting from the interrogation of the safety switch 21 by the test voltage of changing polarity is whether the safety switch 21 is in the first switch setting or in the second switch setting.

In addition, disturbances can also be detected in an improved manner. In the case of line interruption in the line 36 and/or in the line 37 there is no current flow regardless of the polarity of the test voltage. Such a disruption can thus be clearly distinguished from the two possible switch states of the safety switch 21. In the case of a short-circuit between the lines 36, 37 there is always a current flow regardless of the polarity of the test voltage. Such a disruption is also clearly distinguishable from the two switch settings of the safety switch 21.

In the case of the embodiment described on the basis of FIG. 3 all four states, namely the two switch settings of the safety switch 21, a line interruption and a short-circuit, can therefore be distinguished from one another. This simplifies fault recognition and fault evaluation.

The independent energy supply device 30 is also provided in this embodiment for interrogation of the electrical safety circuit 22. In this embodiment the independent energy supply device 30 comprises a plurality of battery elements 40. The battery elements 40 can in that case be checked within the scope of predetermined maintenance and in a given case exchanged.

FIG. 4 shows in schematic illustration, in the manner of a detail, a monitoring system 1 for a transport installation 2 for persons corresponding with a fourth embodiment. In this embodiment the safety switch 21 and further safety switches 41, 42 are arranged in the electrical safety circuit 22. The safety switches 21, 41, 42 are connected in series. The safety circuit 22 is closed in a first combination of switch settings of the safety switches 21, 41, 42. This first combination of switch settings is illustrated in FIG. 4. The safety circuit 22 is interrupted at at least one of the safety switches 21, 41, 42 in each other combination of switch settings. The electrical safety circuit 22 is thus interrupted in every other combination of switch settings.

In the first combination of switch settings the characteristic, which has dependency on current direction, of the unit 35 is interrogated, the unit being constructed as a diode 35. In the first combination of switch settings a current flow is produced only in the case of one polarity of the test voltage. It is thereby ascertained that the electrical safety circuit 22 is closed. The interrogation device 20 is in that case also supplied with power from the independent energy supply device 30 during power interruption.

In the case of a disruption in the form of a short-circuit between the lines 36, 37 current flow is achieved for both polarities of the test voltage. Disruption can thus be clearly recognized. In the case of disruption in the form of an interruption on at least one of the lines 36, 37 a current flow is not generated for either of the two polarities of the test voltage. Thus, this disruption can also be recognized.

The safety switches 41, 42 serve for monitoring further items of equipment, which can be constructed in correspondence with the equipment 3. Thus, for example, monitoring of several door locks 3 can be carried on one floor. Only two terminals 24, 26 of the interrogation device 20 are required for this monitoring. This reduces production costs. Moreover, a safety circuit 22 can be formed with two lines 36, 37.

FIG. 5 shows a monitoring system 1 for a transport installation 2 for persons in correspondence with a fifth embodiment. In this embodiment the safety circuit 22 additionally has, by contrast to the fourth embodiment described on the basis of FIG. 4, a bridging-over line 43 and a further unit 39 with dependency on current direction.

In this regard, the electrical safety circuit 22 is closed by way of the unit 35, which has dependency on current direction, in the first combination of switch settings. The first combination of switch settings is illustrated in FIG. 5. In every other combination of switch settings the electrical safety circuit 22 is closed by means of the bridging-over line 43 by way of the further unit 39 with dependency on current direction. Thus, in the first combination of switch settings the characteristic, which has dependency on current direction, of the unit 35 is interrogated, whereas in each other combination of switch settings the characteristic, which has dependency on current direction, of the further unit 39 is interrogated. Through application of the test voltage with alternating polarity it can thus be clearly recognized whether the first combination of switch settings is present or whether another combination of switch settings is present. This can in addition be distinguished from disruptions such as a short-circuit or a line breakage. In the case of a short-circuit between the lines 36, 37 there is always a current flow regardless of the polarity of the test voltage. In the case of an interruption on at least one of the lines 36, 37 there is no current flow regardless of the polarity of the test voltage. In the case of a short-circuit in the region of the safety switches 21, 41, 42, moreover, different behavior is detected as soon as the switch setting is relevant. For example, the safety switch 42 can be bridged over by a short-circuit. If now the safety switch 42 is switched over from the switch setting illustrated in FIG. 5 then a current flow results regardless of the polarity of the test voltage, because current flows in one direction by way of the short-circuited safety switch 42 and by way of the diode 35. In the other direction the current flow is by way of the diode 39 and the bridging-over line 43 connected to the safety switch 42 on the line 36. This is exactly the test pattern which corresponds with a short-circuit. A short-circuit on one of the safety switches 21, 41, 42 can thus also be recognized when this is relevant.

Depending on the respective design of the monitoring system 1 also several constructional units 11 arranged at different floors can be provided. In this regard, common communication can take place by way of exactly one bus system 6. In a modified embodiment, however, several safety switches 21, 41, 42 can also be distributed over several floors and are interrogated by way of one interrogation device 20. Moreover, different designs with respect to the fault report or fault interrogation can be realized. In particular, the central control 5 can interrogate the switch monitoring. Additionally or alternatively an independent report to the central control 5 can also be carried out.

There is thus also the advantage that in the case of infrequently actuated safety switches 21, 41, 42 an interruption of the line present in the closer path can be recognized so that also a second fault which may occur later, for example a short-circuit in the opener path, cannot lead to a safety-relevant fault.

Reliable interrogation of an item of equipment 3 can in that case be achieved by way of a simple two-core line or, however, also by way of a three-core line. Interrogation of the switching state is made possible by way of the test voltage with the changing polarity, which can take place sporadically or with rapidly changing frequency.

The input and/or output terminals 24, 26, 27 can serve in alternating manner as input terminal 24, 26, 27 and output terminal 24, 26, 27. In particular, in that regard a predetermined voltage can be applied in alternation at the respective input and/or output terminal 24, 26, 27 and be measured relative to another input and/or output terminal 24, 26, 27. As a result, the voltage can be present once positively and once negatively at the safety circuit 22 when a specific throughflow direction is defined.

The unit 35 with dependency on current direction and in a given case the further unit 39 with dependency on current direction are preferably mounted on the last safety switch 21. The number of diodes 35, 39 required for each current path can thus be reduced.

Although the invention has been described by the illustration of specific embodiments it will be obvious that numerous further variants of embodiment can be created with knowledge of the present invention. For example, the most diverse safety-relevant switches of the transport installation for persons, for example also car doors, access doors of engine rooms and the like, can be supplemented or monitored by the monitoring device according to the invention.

In accordance with the provisions of the patent statutes, the present invention has been described in what is considered to represent its preferred embodiment. However, it should be noted that the invention can be practiced otherwise than as specifically illustrated and described without departing from its spirit or scope.

The invention claimed is:

1. A monitoring system for transport installations for persons, which installations are arranged as elevator, escalator or moving walkway, comprising:
   at least one interrogation device;
   at least one safety switch connected with the at least one interrogation device by an electrical safety circuit, the at least one safety'switch monitoring an item of equipment of the transport installation for persons, wherein the at least one safety switch has at least two switch settings; and
   an independent energy supply device supplying the at least one interrogation device with electrical energy, wherein independently of a presence of an external energy supply of the transport installation a change from one of the at least two switch settings to another of the at least two switch settings is detected by the at least one interrogation device and the at least one interrogation device generates at least one status signal in response to the change in the switch settings;
   wherein the independent energy supply device is arranged at the at least one interrogation device and the at least one interrogation device applies a test voltage to the electrical safety circuit.

2. The monitoring system according to claim 1 wherein the independent energy supply includes at least one of a battery element and an accumulator element.

3. The monitoring system according to claim 2 when the external energy supply is present the at least one interrogation device is supplied with electrical energy from the external energy supply and the independent energy supply device is charged by the external energy supply, and when the external energy supply is interrupted the independent energy supply device supplies electrical energy to the at least one interrogation device.

4. The monitoring system according to claim 1 wherein the at least one safety switch can be switched to a first switch setting that closes the electrical safety circuit by a first line section connected to the at least one interrogation device, and can be switched to a second switch setting that closes the electrical safety circuit by a second line section connected to the at least one interrogation device.

5. The monitoring system according to claim 4 wherein the first line section is connected with a first input or output terminal of the at least one interrogation device, the second line section is connected with a second input or output terminal of the at least one interrogation device, a return line is connected with a third input or output terminal of the at least one interrogation device, the at least one safety switch in the first switch setting closes the electrical safety circuit by the first line section and the return line, and the at least one safety switch in the second switch setting closes the electrical safety circuit by the second line section and the return line.

6. The monitoring system according to claim 1 including at least one unit with dependency on current direction is present in the electrical safety circuit and in addition the at least one interrogation device is arranged to apply a test voltage with a changing polarity to the electrical safety circuit.

7. The monitoring system according to claim 6 wherein the at least one safety switch in a first switch setting or in a first combination of switch settings closes the electrical safety circuit by the at least one unit with dependency on current direction.

8. The monitoring system according to claim 7 wherein the at least one safety switch in a second switch setting or in another combination of switch settings differing from the first combination of switch settings opens the electrical safety circuit.

9. The monitoring system according to claim 7 wherein the at least one safety switch in a second switch setting or in another combination of switch settings differing from the first combination of switch settings closes the electrical safety circuit by another unit with dependency on current direction.

10. The monitoring system according to claim 6 wherein the at least one interrogation device applies the test voltage to the electrical safety circuit between a first terminal and a second terminal of the at least one interrogation device.

11. The monitoring system according to claim 1 wherein the at least one interrogation device in response to actuation of the item of equipment monitored by the at least one safety switch reports the actuation to a central control through an interface and a bus system.

12. The monitoring system according to claim 11 including an RFID interface connected with the bus system by the interface.

13. A transport installation for persons, which installation is arranged as an elevator, an escalator or a moving walkway, including the monitoring system according to claim 1 and the item of equipment being monitored by the monitoring system.

14. A method of monitoring a transport installation for persons, which installation is arranged as elevator, escalator or moving walkway, wherein at least one item of equipment of the transport installation is monitored by an electrical safety circuit with at least one safety switch, comprising the steps of:

providing an independent energy supply device supplying an interrogation device with electrical energy is present;

monitoring of the electrical safety circuit with the interrogation device by application of a test voltage whereby independently of a presence of an external energy supply of the transport installation a change in a switch setting of the at least one safety switch is detected by the interrogation device and the interrogation device responds to the detection by generating at least one status signal representing the change in the switch setting.

15. A monitoring system for transport installations for persons, which installations are arranged as elevator, escalator or moving walkway, comprising:

at least one interrogation device;

at least one safety switch connected with the at least one interrogation device by an electrical safety circuit, the at least one safety switch monitoring an item of equipment of the transport installation for persons, wherein the at least one safety switch has at least two switch settings;

an independent energy supply device supplying the at least one interrogation device with electrical energy, wherein independently of a presence of an external energy supply of the transport installation a change from one of the at least two switch settings to another of the at least two switch settings is detected by the at least one interrogation device and the at least one interrogation device generates at least one status signal in response to the change in the switch settings; and at least one unit with dependency on current direction is present in the electrical safety circuit and in addition the at least one interrogation device is arranged to apply a test voltage with a changing polarity to the electrical safety circuit.

* * * * *